(12) United States Patent
Kamei

(10) Patent No.: US 7,952,116 B2
(45) Date of Patent: May 31, 2011

(54) GALLIUM NITRIDE-BASED COMPOUND SEMICONDUCTOR LIGHT-EMITTING DEVICE

(75) Inventor: Koji Kamei, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/776,502

(22) Filed: May 10, 2010

(65) Prior Publication Data

US 2010/0213501 A1     Aug. 26, 2010

Related U.S. Application Data

(63) Continuation of application No. 12/093,758, filed as application No. PCT/JP2006/323052 on Nov. 14, 2006, now Pat. No. 7,741,653.

(60) Provisional application No. 60/739,003, filed on Nov. 23, 2005.

(30) Foreign Application Priority Data

Nov. 16, 2005    (JP) .................................. 2005-331607

(51) Int. Cl.
    *H01L 33/00*    (2010.01)
(52) U.S. Cl. ...................... 257/99; 257/98; 257/E31.126
(58) Field of Classification Search .................... 257/98, 257/99, E31.126
    See application file for complete search history.

(56) References Cited

U.S. PATENT DOCUMENTS

| | | | |
|---|---|---|---|
| 6,995,401 B2 * | 2/2006 | Yamada et al. ................. | 257/79 |
| 7,061,026 B2 * | 6/2006 | Huang ........................... | 257/103 |
| 7,105,850 B2 | 9/2006 | Wu et al. | |
| 2002/0130605 A1 | 9/2002 | Mueller et al. | |
| 2003/0183828 A1 | 10/2003 | Lee et al. | |
| 2005/0040427 A1 | 2/2005 | Sugawara et al. | |
| 2007/0029568 A1 | 2/2007 | Choo et al. | |
| 2007/0170461 A1 | 7/2007 | Kamei | |

(Continued)

FOREIGN PATENT DOCUMENTS

JP    2002-353506 A    12/2002

(Continued)

OTHER PUBLICATIONS

C S Chang, et al.; "InGaN/GaN light-emitting diodes with ITO p-contact layers prepared by RF sputtering"; Semiconductor Science and Technology; vol. 18, No. 4; Apr. 2003; pp. L21-23; XP002540720.

(Continued)

*Primary Examiner* — Evan Pert
*Assistant Examiner* — Eduardo A Rodela
(74) *Attorney, Agent, or Firm* — Sughrue Mion, PLLC

(57) ABSTRACT

The present disclosure relates to a gallium nitride-based compound semiconductor light-emitting device with low driving voltage and high light emission output, which has a positive electrode comprising a transparent electrically conducting layer put into direct contact with a p-type semiconductor layer. An embodiment of the disclosure includes a gallium nitride-based compound semiconductor light-emitting device, which includes an n-type semiconductor layer, a light-emitting layer and a p-type semiconductor layer, which may be formed in this order on a substrate, wherein each layer comprises a gallium nitride-based compound semiconductor, the light-emitting device has a negative electrode and a positive electrode provided on the n-type semiconductor layer and a region having a semiconductor metal concentration of 20 at. % or more, based on all metals, is present in the transparent electrically conducting film on the semiconductor side surface of the transparent electrically conducting film.

16 Claims, 6 Drawing Sheets

U.S. PATENT DOCUMENTS

| | | |
|---|---|---|
| 2008/0074050 A1 | 3/2008 | Chen et al. |
| 2008/0135868 A1 | 6/2008 | Okagawa et al. |
| 2008/0176098 A1 | 7/2008 | Forrest et al. |
| 2009/0072751 A1 | 3/2009 | Tischler et al. |

FOREIGN PATENT DOCUMENTS

| | | |
|---|---|---|
| JP | 2003-17748 A | 1/2003 |
| JP | 2003-179263 A | 6/2003 |
| JP | 2005-217331 A | 8/2005 |
| KR | 2001-98806 A | 11/2001 |
| KR | 2003-0075747 A | 9/2003 |
| TW | 513816 | 12/2002 |
| TW | 200529477 A | 9/2005 |
| TW | M279022 | 10/2005 |

OTHER PUBLICATIONS

Michael J Garter et al.; "Temperature Behavior of Visible and Infrared Electroluminescent Devices Fabricated on Erbium-Doped GaN"; IEEE Transactions on Electron Devices; vol. 49, No. 1; Jan. 1, 2002; pp. 48-54; XP011017928.

J.D. Hwang et al.; "Gallium nitride photoconductive ultraviolet sensor with a sputtered transparent indium-tin-oxide ohmic contact"; Thin Solid Films; vol. 491, No. 1-2; Jul. 11, 2005; pp. 276-279; XP005082980.

J.D. Hwang et al.; "A novel transparent ohmic contact of indium tin oxide to n-type GaN"; Microelectronic Engineering; vol. 77, No. 1; Jan. 1, 2005; pp. 71-75; XP004652475.

\* cited by examiner

US 7,952,116 B2

GALLIUM NITRIDE-BASED COMPOUND SEMICONDUCTOR LIGHT-EMITTING DEVICE

CROSS REFERENCE TO RELATED APPLICATION

This application is a Rule 53(b) Continuation of U.S. application Ser. No. 12/093,758 filed May 15, 2008, which is a 371 of PCT Application No. PCT/JP2006/323052 filed Nov. 14, 2006, and which claims benefit of Japanese Patent Application No. 2005-331607 filed Nov. 16, 2005 and U.S. Provisional Application No. 60/739,003 filed Nov. 23, 2005. The above-noted applications are incorporated herein by reference in their entirety.

TECHNICAL FIELD

The present invention relates to a gallium nitride based compound semiconductor light-emitting device. More specifically, the present invention relates to a face-up type gallium nitride-based compound semiconductor light-emitting device equipped with a positive electrode having excellent light-transparency and ohmic properties.

BACKGROUND ART

In recent years, a GaN-based compound semiconductor material has attracted attention as a semiconductor material for short-wavelength light-emitting devices.

The GaN-based compound semiconductor is formed on various oxide substrates such as sapphire single crystal or a Group III-V compound substrate by a metal organic chemical vapor deposition method (MOCVD method), a molecular beam epitaxy (MBE method) or the like.

A characteristic feature of the GaN-based compound semiconductor material is that the current diffusion in the transverse direction is small. This is attributable to many dislocations present in the epitaxial crystal and penetrating from the substrate to the surface, but the details are not known. Furthermore, in a p-type GaNbased compound semiconductor, the resistivity is high as compared with the resistivity of an n-type GaN-based compound semiconductor and, therefore, unless the material coming into ohmic contact with the p-type GaN-based compound semiconductor is made to be a positive electrode, the driving voltage greatly increases.

The material coming into ohmic contact with the p-type GaN-based compound semiconductor is mainly a metal and, in particular, a metal having a high work function readily establishes ohmic contact. Also, from the standpoint of light penetration, the positive electrode is preferably transparent to light. Therefore, a metal material which easily makes ohmic contact with a p-type GaN-based compound semiconductor has heretofore been formed into a thin film to thereby achieve both low resistance and light transparency.

When a metal is formed into a thin film, there arises a problem that the resistance in the diffusion direction becomes high. To solve this problem, a positive electrode having a two-layer structure consisting of an ohmic contact layer comprising a thin-film metal and a current diffusion layer comprising a transparent electrically conducting film having high light transmittance has been proposed (see, for example, Japanese Patent No. 294173).

In order to fabricate a brighter light-emitting device (LED), the presence of a metal layer which reflects or absorbs light must be eliminated. For this purpose, a method of bringing a transparent electrically conducting film itself into ohmic contact with a p-type GaN-based compound semiconductor has been studied (see, for example, Japanese Unexamined Patent Publication No. 2001-210867). In Japanese Unexamined Patent Publication No. 2001-210867, it is proposed to produce a transparent electrically conducting film coming into direct contact with a p-type GaN-based compound semiconductor by a method other than a sputtering method. In the sputtering method, the contact resistance is high because the p-type GaN-based compound semiconductor layer is damaged, and a low operating voltage cannot be obtained. However, when a transparent electrically conducting film is formed by a method other than sputtering and, then, the thickness of the transparent electrically conducting film is increased by a sputtering method, as the film-forming method is changed on the way of constructing a stacked structure, the resistance increases at the interface where the method is changed. Also, the productivity is poor.

DISCLOSURE OF THE INVENTION

An object of the present invention is to provide a gallium nitride-based compound semiconductor light-emitting device with low driving voltage and high light emission output, which has a positive electrode comprising a transparent electrically conducting layer put into direct contact with a p-type semiconductor layer. Another object of the present invention is to provide a gallium nitride-based compound semiconductor light-emitting device having a positive electrode with low contact resistance and excellent current diffusibility, where a plurality of transparent electrically conducting film layers having different purposes are formed by a consistent film-forming technique without damaging a p-type semiconductor layer at the formation of transparent electrically conducting film layers.

The present inventors have found, for example, that: when a semiconductor metal mixed layer and a positive electrode metal mixed layer are appropriately formed on the semiconductor side surface of a transparent electrically conducting film layer constituting a positive electrode and on the positive electrode side surface of a p-type semiconductor, respectively, low contact resistance can be obtained; when a transparent electrically conducting film layer is formed to have a stacked structure including at least two layers of a transparent electrically conducting film contact layer put into direct contact with a p-type GaN-based compound semiconductor and a transparent electrically conducting film current diffusion layer and the transparent electrically conducting film contact layer is formed by an RF sputtering method, the transparent electrically conducting film layer can be formed without damaging a p-type gallium nitride-based compound semiconductor; when a transparent electrically conducting film current diffusion layer is continuously stacked on a transparent electrically conducting film contact layer by a DC sputtering method, the increase in resistance at the interface between these two layers can be suppressed; when a transparent electrically conducting film current diffusion layer is formed to have a large thickness, the diffusion of current can be increased while maintaining high light transparency; and when a transparent electrically conducting film layer is heat-treated after the film formation, a large concentration gradient of a semiconductor metal is generated in the semiconductor metal mixed layer. The present invention has been accomplished based on these findings.

That is, the present invention provides the following inventions.

(1) A gallium nitride-based compound semiconductor light-emitting device comprising an n-type semiconductor layer, a light-emitting layer and a p-type semiconductor layer which are formed in this order on a substrate, wherein each layer comprises a gallium nitride-based compound semiconductor, the light-emitting device has a negative electrode and a positive electrode provided on the n-type semiconductor layer and on the p-type semiconductor layer, respectively, the positive electrode is at least partially formed of a transparent electrically conducting film, the transparent electrically conducting film is at least partially in contact with the p-type semiconductor layer, a semiconductor metal mixed layer containing a Group III metal component is present on the semiconductor side surface of the transparent electrically conducting film, and the thickness of the semiconductor metal mixed layer is from 0.1 to 10 nm.

(2) The gallium nitride-based compound semiconductor light-emitting device according to item 1, above, wherein a region having a semiconductor metal concentration of 20 at. % or more based on all metals is present in the semiconductor metal mixed layer.

(3) The gallium nitride-based compound semiconductor light-emitting device according to item 1 or 2 above, wherein a region having a semiconductor metal concentration of 40 at. % or more based on all metals is present in the range of less than 3 nm from the semiconductor/transparent electrically conducting film interface of the semiconductor metal mixed layer.

(4) The gallium nitride-based compound semiconductor light-emitting device according to any one of items 1 to 3 above, wherein the semiconductor metal concentration in the range of 3 nm or more from the semiconductor/transparent electrically conducting film interface of the semiconductor metal mixed layer is 15 at. % or less based on all metals.

(5) The gallium nitride-based compound semiconductor light-emitting device according to any one of items 1 to 4 above, wherein the transparent electrically conducting film is formed at room temperature and, after the film formation, is heat-treated at 300 to 700° C.

(6) The gallium nitride-based compound semiconductor light-emitting device according to any one of items 1 to 5 above, wherein the transparent electrically conducting film comprises a transparent electrically conducting film contact layer and a transparent electrically conducting film current diffusion layer, and the transparent electrically conducting film contact layer is in contact with the p-type semiconductor layer.

(7) The gallium nitride-based compound semiconductor light-emitting device according to item 6 above, wherein the transparent electrically conducting film contact layer is formed by an RF sputtering method.

(8) The gallium nitride-based compound semiconductor light-emitting device according to item 6 or 7 above, wherein the transparent electrically conducting film current diffusion layer is formed by a DC sputtering method.

(9) The gallium nitride-based compound semiconductor light-emitting device according to any one of items 6 to 8 above, wherein the thickness of the transparent electrically conducting film contact layer is from 1 to 5 nm.

(10) The gallium nitride-based compound semiconductor light-emitting device according to any one of items 6 to 9 above, wherein the thickness of the transparent electrically conducting film current diffusion layer is from 150 to 500 nm.

(11) The gallium nitride-based compound semiconductor light-emitting device according to any one of items 6 to 10 above, wherein the transparent electrically conducting film current diffusion layer takes different structures between the sides close to and remote from the p-type semiconductor and the structure of the layer on the side remote from the semiconductor is a columnar structure.

(12) The gallium nitride-based compound semiconductor light-emitting device according to item 11 above, wherein the film thickness of the structure layer on the side closer to the semiconductor is from 30 to 100 nm.

(13) The gallium nitride-based compound semiconductor light-emitting device according to any one of items 1 to 12 above, wherein a positive electrode metal mixed layer containing a metal component of the transparent electrically conducting film is present in the p-type semiconductor layer.

(14) The gallium nitride-based compound semiconductor light-emitting device according to item 13 above, wherein the thickness of the positive electrode metal mixed layer is from 0.1 to 5 nm.

(15) The gallium nitride-based compound semiconductor light-emitting device according to item 13 or 14 above, wherein the concentration of the transparent electrically conducting film metal component in the positive electrode metal mixed layer is from 0.1 to 20 at. % based on the all metals in the positive electrode metal mixed layer.

(16) The gallium nitride-based compound semiconductor light-emitting device according to any one of items 1 to 15 above, wherein the transparent electrically conducting film comprises an oxide of at least one metal selected from the group consisting of In, Sn, Zn, Al, Ti, V, Cr, Mn, Fe, Co, Ni, Cu, Ga, Ge, Y, Zr, Nb, Mo, Tc, Ru, Rh, Pd, Ag, Sb, Hf, Ta, W, Re, Os, Ir and Pt.

(17) The gallium nitride-based compound semiconductor light-emitting device according to item 16 above, wherein the transparent electrically conducting film comprises an oxide of at least one metal selected from the group consisting of In, Sn, Zn, Al, Cu, Ag, Ga, Ge, W, Mo and Cr.

(18) A lamp comprising the gallium nitride-based compound semiconductor light-emitting device according to any one of items 1 to 17 above.

(19) An electronic device incorporating the lamp according to item 18 above.

(20) A machine incorporating the electronic device according to item 19 above.

The gallium nitride-based compound semiconductor light-emitting device of the present invention appropriately has a semiconductor metal mixed layer containing a Group III metal, constituting the semiconductor, on the semiconductor side surface of the transparent electrically conducting film layer constituting the positive electrode, so that the contact resistance between the positive electrode and the p-type semiconductor layer can be small. Also, in the semiconductor metal mixed layer, a large concentration gradient of the semiconductor metal is generated to have a high semiconductor metal proportion in the vicinity of the semiconductor/transparent electrically conducting film layer interface and a low semiconductor metal proportion at the position remote from the interface, so that the contact resistance between the semiconductor and the transparent electrically conducting film layer can be reduced in the vicinity of the interface, good crystallinity of the semiconductor can be maintained at the position remote from the interface, and the light-emitting device can have a low resistance.

Furthermore, a positive electrode metal mixed layer containing a metal constituting the transparent electrically conducting film layer of the positive electrode is caused to be appropriately present on the positive electrode side surface of the p-type semiconductor layer, so that the contact resistance between the semiconductor and the transparent electrically conducting film layer can be more reduced.

BEST MODES FOR CARRYING OUT THE INVENTION

Figure 1:
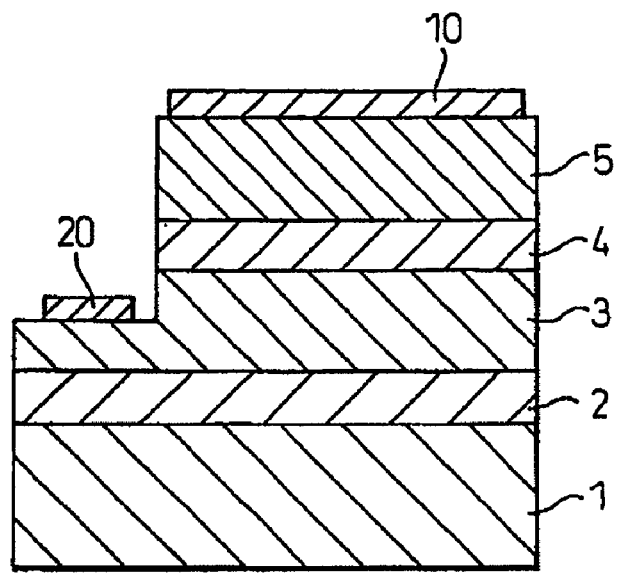
FIG. 1 is a schematic view illustrating a general structure of the inventive gallium nitride-based compound semiconductor light-emitting device.

The gallium nitride-based compound semiconductor light-emitting device of the present invention is a semiconductor light-emitting device fabricated by, as shown in FIG. 1, stacking a gallium nitride-based compound semiconductor on a substrate (1), through a buffer layer (2) as needed, forming an n-type semiconductor layer (3), a light-emitting layer (4) and a p-type semiconductor layer (5), partially removing the light-emitting layer and the p-type semiconductor layer, forming a negative electrode (20) on the exposed n-type semiconductor layer, and forming a positive electrode (10) on the remaining p-type semiconductor layer.

For the substrate, known substrate materials can be used without any restrictions, examples including: an oxide single crystal such as a sapphire single crystal ($Al_2O_3$; A-plane, C-plane, M-plane, R-plane), a spinel single crystal ($MgAl_2O_4$), a ZnO single crystal, a $LiAlO_2$ single crystal, $LiGaO_2$ single crystal, and a MgO single crystal; a Si single crystal; a SiC single crystal; a GaAs single crystal; an AlN single crystal; a GaN single crystal; and a boride single crystal such as $ZrB_2$. The plane orientation of the substrate is not limited to any specific direction. The crystal plane of the substrate may be inclined to a specific crystal plane or not inclined.

For the construction of the n-type semiconductor layer, the light-emitting layer, and the p-type semiconductor layer, there are various known structures which can be used without any restrictions. The p-type semiconductor layer may have a conventional carrier concentration. Notably, the transparent electrode of the present invention may also be applicable to a p-type semiconductor layer having a low carrier concentration (e.g., about $1 \times 10^{17}$ $cm^{-3}$).

For the gallium nitride-based compound semiconductor used to form these layers, semiconductors of various compositions, represented by the general formula $Al_xIn_yGa_{1-x-y}N$ ($0 \leq x < 1$, $0 \leq y < 1$, $0 \leq x+y < 1$), are known, and any of the semiconductors of various compositions, represented by the general formula $Al_xIn_yGa_{1-x-y}N$ ($0 \leq x < 1$, $0 \leq y < 1$, $0 \leq x+y < 1$), including the known ones, can be used without any restrictions as the gallium nitride-based compound semiconductor for forming the n-type semiconductor layer, the light-emitting layer and the p-type semiconductor layer in the present invention.

The method for growing such gallium nitride-based compound semiconductors is not specifically limited, and any known method for growing gallium nitride-based compound semiconductors, such as MOCVD (Metal Organic Chemical Vapor Deposition), HVPE (Hydride Vapor Phase Epitaxy), and MBE (Molecular Beam Epitaxy), can be used. MOCVD is the preferred growth method from the viewpoint of the controllability of the film thickness and mass-producibility. In the MOCVD method, hydrogen ($H_2$) or nitrogen ($N_2$) is used as the carrier gas, and trimethylgallium (TMG) or triethylgallium (TEG), trimethylaluminum (TMA) or triethylaluminum (TEA), and trimethylindium (TMI) or triethylindium (TEI) are used as the Ga source, the Al source, and the In source, respectively, which are the source materials from group III, while ammonia ($NH_3$), hydrazine ($N_2H_4$), etc. are used as the N sources, the source materials from group V. As for the dopants, mono-silane ($SiH_4$) or di-silane ($Si_2H_6$) as the Si source material and germane ($GeH_4$) or an organic germanium compound as the Ge source material are used for the n-type, and bis(cyclopentadienyl)magnesium ($Cp_2Mg$) or bis(ethylcyclopentadienyl)magnesium (($EtCp)_2Mg$), for example, is used as the Mg source material for the p-type.

To form the negative electrode in contact with the n-type semiconductor layer in the gallium nitride-based compound semiconductor fabricated by forming the n-type semiconductor layer, the light-emitting layer, and the p-type semiconductor layer in this order on the substrate, the light-emitting layer and the p-type semiconductor layer are partially removed to expose the underlying n-type semiconductor layer. After that, the inventive transparent positive electrode is formed on the unremoved region of the p-type semiconductor layer, and the negative electrode is formed on the exposed n-type semiconductor layer. Negative electrodes of various compositions and structures are known, and any of negative electrodes of various compositions and structures, including the known ones, can be used as the negative electrode without any restrictions.

Figure 2:
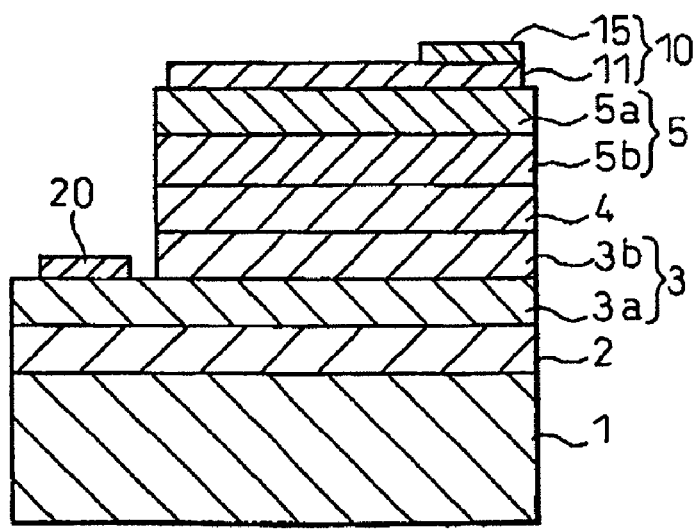
FIG. 2 is a schematic view illustrating an embodiment of the inventive gallium nitride-based compound semiconductor light-emitting device.

For instance, there can be used the stacked structure shown in FIG. 2 that is obtained by successively stacking, on a sapphire substrate (1), a buffer layer (2) composed of an AlN, a n-type semiconductor layer (3) which consists of an n-type contact layer (3a) composed of an n-type GaN and an n-type clad layer (3b) composed of an n-type GaN, a light-emitting layer (4) composed of an InGaN, and p-type semiconductor layer (5) which consists of an p-type contact layer (5a) composed of a p-type GaN and a p-type clad layer (5b) composed of a p-type AlGaN.

The p-type contact layer (5a), p-type clad layer (5b), light-emitting layer (4) and n-type clad layer (3b) of the gallium nitride-based compound semiconductor stacked structure are partly removed by etching, and a conventional negative electrode (20) of, for example, Ti/Au is formed on the exposed n-type contact layer (3a), and a positive electrode (10) is formed on the remained p-type contact layer (5a).

In the present invention, the positive electrode (10) has at least a transparent electrically conducting film (11) put into contact with the p-type semiconductor layer. On a part of the transparent electrically conducting film (11), a bonding pad layer (15) is provided for establishing electrical connection with a circuit board, a lead frame or the like.

The transparent electrically conducting film is transparent to light in the emission wavelength region and composed of a material having electrical conductivity. For example, the transparent electrically conducting film is composed of an oxide of at least one metal selected from the group consisting of In, Sn, Zn, Al, Ti, V, Cr, Mn, Fe, Co, Ni, Cu, Ga, Ge, Y, Zr, Nb, Mo, Tc, Ru, Rh, Pd, Ag, Sb, Hf, Ta, W, Re, Os, Ir and Pt. Among these, an oxide of at least one metal selected from the group consisting of In, Sn, Zn, Al, Cu, Ag, Ga, Ge, W, Mo and Cr is preferred because of its good light transparency and high electrical conductivity. Particularly, ITO in various compositions is preferred.

The thickness of the transparent electrically conducting film is preferably from 50 to 1,000 nm. If the thickness is less than 50 nm, the sheet resistance value is disadvantageously low, whereas if it exceeds 1,000 nm, the productivity is worsened. The thickness is more preferably from 100 to 500 nm, still more preferably from 150 to 300 nm.

The transparent electrically conducting film is preferably constructed to have a two-layer structure consisting of a transparent electrically conducting film contact layer and a transparent electrically conducting film current diffusion layer. The transparent electrically conducting film contact layer provided in contact with the p-type semiconductor layer is formed without damaging the p-type semiconductor layer at the film formation. For this purpose, the energy entering the p-type semiconductor layer needs to be made as low as possible. The transparent electrically conducting film contact layer is formed with weak incident energy and therefore, the density of the film becomes low. The thickness of the transparent electrically conducting film contact layer is preferably from 1 to 5 nm. If the film thickness is less than 1 nm, the p-type semiconductor layer is damaged at the formation of the transparent electrically conducting film diffusion layer, whereas if it exceeds 5 nm, the current diffusion effect is weak in the transparent electrically conducting film contact layer and the current diffusion effect of the entire transparent electrically conducting film is reduced. The film thickness is more preferably from 1.5 to 3.5 nm.

The transparent electrically conducting film current diffusion layer subsequently formed satisfies both high light transmittance and low sheet resistance. The transparent electrically conducting film current diffusion layer is preferably a high-density film for enhancing the current diffusion effect. The thickness of the transparent electrically conducting film current diffusion layer is preferably from 50 to 1,000 nm. If the film thickness is less than 50 nm, low sheet resistance cannot be obtained, whereas if it exceeds 1,000 nm, high light transmittance cannot be obtained. The film thickness is more preferably from 150 to 700 nm. These two layers are preferably formed continuously without intermittence. If a span of time intervenes or the system is transferred to another apparatus, contamination may adhere between two layers or the metal oxide film may be further oxidized to form a high-resistance layer.

When a semiconductor metal mixed layer containing a metal constituting the semiconductor is caused to be present on the semiconductor side surface of the transparent electrically conducting film, the contact resistance between the transparent electrically conducting film and the semiconductor decreases. That is, in the present invention, the "semiconductor metal mixed layer" is defined as a semiconductor metal-containing layer in the transparent electrically conducting film, and the layer containing the semiconductor metal component in an amount of 3 at. % or more based on all metal components, which is present in the transparent electrically conducting layer, is referred to as a "semiconductor metal mixed layer".

The thickness of the semiconductor metal mixed layer is preferably from 0.1 to 10 nm. If the thickness is less than 0.1 nm or exceeds 10 nm, low contact resistance can be difficult to obtain. In order to obtain lower contact resistance, the thickness is more preferably from 1 to 8 nm.

As for the proportion of the semiconductor metal contained in the semiconductor metal mixed layer, a region containing the semiconductor metal at a proportion of 20 at. % or more based on all metal components is preferably present. The proportion has a distribution, and the proportion of the semiconductor-forming metal is higher as closer to the semiconductor/transparent electrically conducting film interface. Particularly, a region, where the semiconductor metal proportion is 40 at. % or more based on all metals in the semiconductor metal mixed layer, is preferably present in the range of less than 3 nm from the semiconductor/transparent electrically conducting film interface. This means that the diffusion of the semiconductor metal into the transparent electrically conducting film is proceeding in the vicinity of the semiconductor/transparent electrically conducting film interface, that is, in the range of less than 3 nm from the interface, and thereby the contact resistance is decreased.

The details of this mechanism have not been elucidated but, in view of the energy level diagram at the contact interface of p-type GaN/transparent electrically conducting film, a hole and an electron are located in closer distance to each other when diffusion is proceeding as compared with the case of no occurrence of diffusion, and a larger number of recombination centers are thought to be generated. It may also be presumed that when a recombination center is present, holes or electrons flow into that region to give an electrically neutral and low barrier state.

On the other hand, in the range 3 nm or more remote from the semiconductor/transparent electrically conducting film interface, the proportion of the semiconductor metal is preferably 15 at. % or less. If the semiconductor metal proportion exceeds 15 at. % in this range, the driving voltage of the light-emitting device sometimes increases. That is, the transparent electrically conducting film 3 nm or more remote from the semiconductor/transparent electrically conducting film interface is preferably in a state that the diffusion of the semiconductor metal is not proceeding. This is because if the diffusion of the metal constituting the semiconductor excessively proceeds, the crystal of the semiconductor layer is destroyed and the semiconductor layer comes to have high resistance.

The thickness of the semiconductor metal mixed layer and proportion of the semiconductor-forming metal contained in the layer can be measured by the EDS analysis of sectional TEM image, as is well known to those skilled in the art. Thus, in regard to the transparent electrically conducting film, EDS analysis of a sectional TEM image can be performed at several points, for example five points, in thickness direction from the p-type semiconductor/transparent electrically conducting film interface, and type and content of metal contained at each point can be determined from each chart at these points. If five measurement points are insufficient to determine the thickness, measurement can be made at several additional points.

Also, a positive electrode metal mixed layer, containing the metal constituting the transparent electrically conducting film (i.e. the positive electrode), is preferably present on the surface of the p-type semiconductor layer on the side of the positive electrode. With such construction, contact resistance between the transparent electrically conducting film and the p-type semiconductor layer can be further decreased. In short, a "positive electrode metal mixed layer", as used herein, is defined as a layer containing the metal constituting the transparent electrically conducting film, in the p-type semiconductor layer.

The electrical resistance of the positive electrode metal mixed layer is higher than that of other p-type semiconductor layers but, as the contact resistance between semiconductor and positive electrode becomes low, the driving voltage can be made lowest by forming the positive electrode metal mixed layer in an appropriate film thickness.

The thickness of the positive electrode metal mixed layer is preferably from 0.1 to 5 nm. If the thickness is less than 0.1 nm, the effect of reducing the contact resistance is not sufficiently high, whereas if it exceeds 5 nm, the crystallinity of the semiconductor layer surface is disadvantageously destroyed. The thickness is more preferably from 1 to 3 nm.

The proportion of the transparent electrically conducting film-constituting metal contained in the positive electrode metal mixed layer is preferably from 0.1 to 30 at. %. If the proportion is less than 0.1%, the effect of reducing the contact resistance is not sufficiently high, whereas if it exceeds 30 at. %, the crystallinity of the semiconductor layer surface may be destroyed to increase the resistivity of the semiconductor layer. The proportion is more preferably from 1 to 20 at. %.

The thickness and positive electrode metal content of the positive electrode metal mixed layer can be measured by the EDS analysis of a sectional TEM image similarly to the semiconductor metal mixed layer.

The methods for forming the transparent electrically conducting film, semiconductor metal mixed layer and positive electrode metal mixed layer are described below.

Formation of the transparent electrically conducting film on a p-type semiconductor layer (i.e. formation of the transparent electrically conducting film contact layer) is preferably carried out through sputtering based on RF discharge. It has been elucidated that an electrode exhibiting low contact resistance can be formed through RF discharge sputtering rather than through vapor deposition or DC discharge sputtering.

Figure 5:
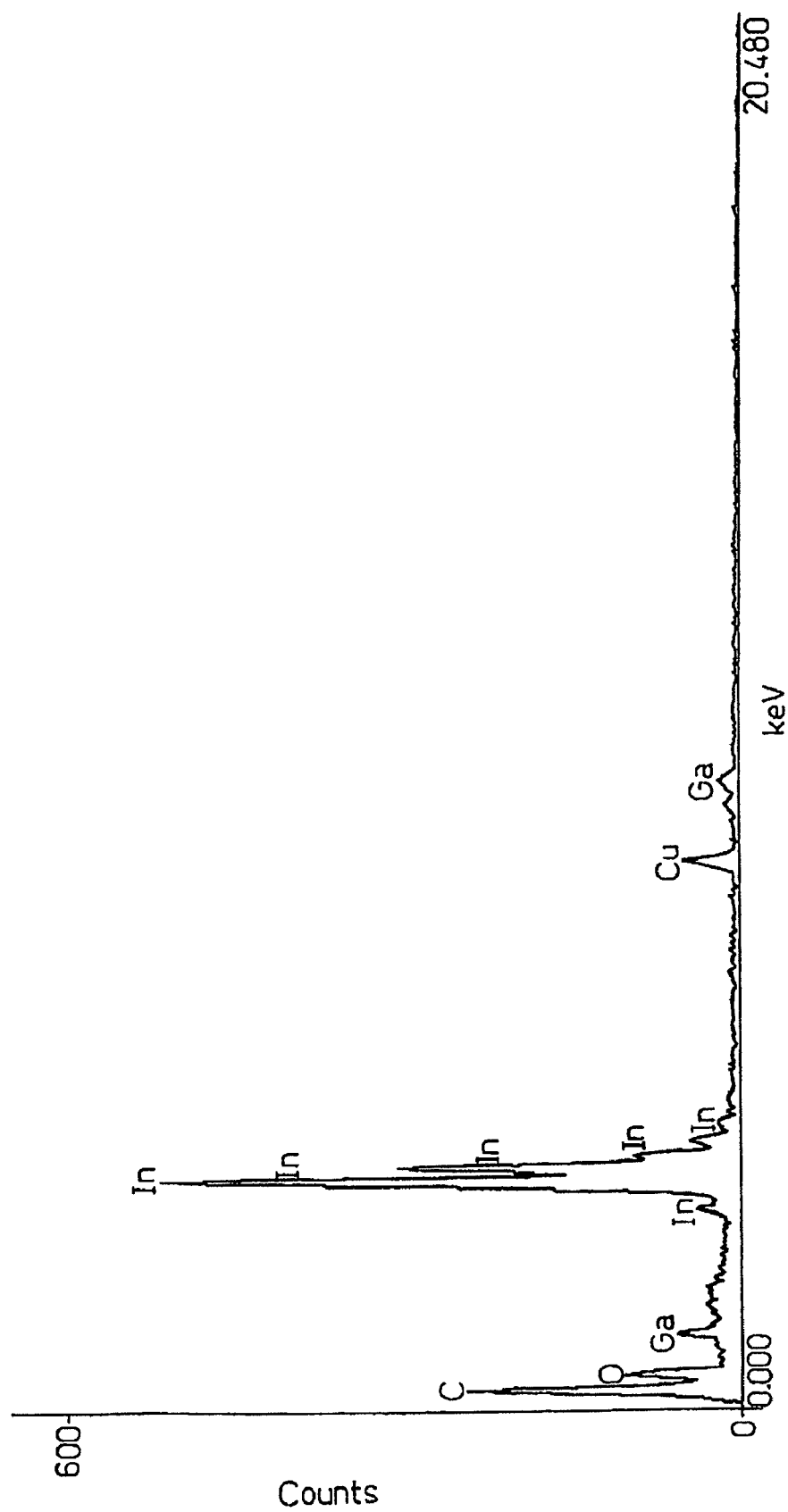
FIG. 5 is an exemplary chart showing results of the EDS analysis of a sectional TEM image of a transparent electrically conducting film contact layer.

In film formation through RF discharge sputtering, sputtered atoms deposited on the p-type semiconductor layer gain energy through ion-assisting effect. Thus, diffusion of the sputtered atoms in the surface portion of p-type semiconductor (e.g., Mg-doped p-type GaN) is considered to be promoted. In addition, atoms forming the top surface of the p-type semiconductor are imparted with energy during film formation. Thus, diffusion of a semiconductor material (e.g., Ga) into the transparent electrically conducting film contact layer is considered to be promoted. Through EDS analysis of a sectional TEM image of the transparent electrically conducting film contact layer (i.e., film formed on the p-type GaN layer through RF sputtering), a portion containing both Ga originating from the semiconductor (i.e., a semiconductor metal mixed layer) was observed (see FIG. 5 showing one example of analysis results of a transparent electrically conducting film contact layer obtained in Example 1 of the present invention).

Figure 6:
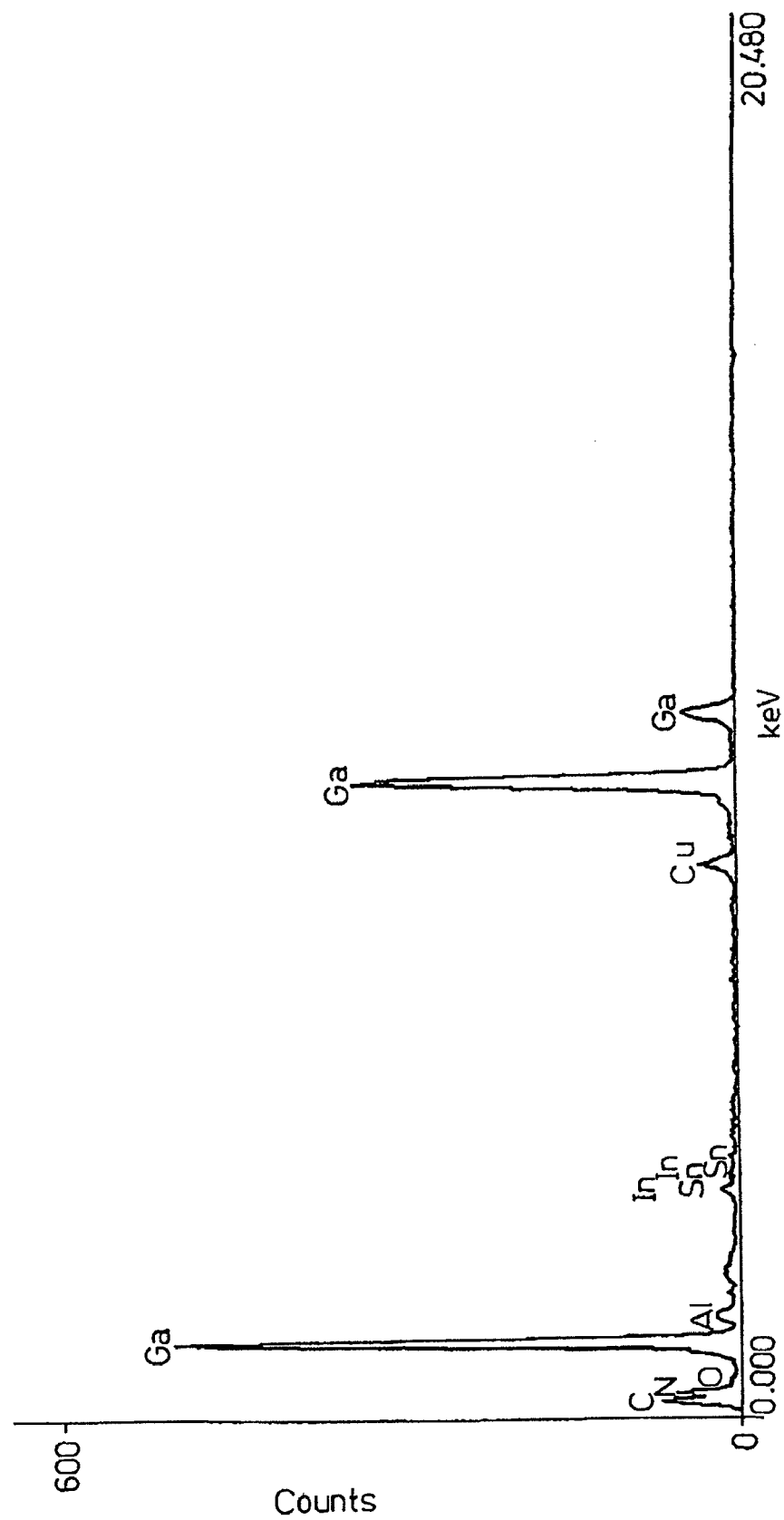
FIG. 6 is an exemplary chart showing results of the EDS analysis of a sectional TEM image of a p-type contact layer.

On the other hand, a region where In and Sn derived from the transparent electrically conducting film were detected by the EDS analysis of the sectional TEM image, that is, a positive electrode metal mixed layer was confirmed on the semiconductor side (see, FIG. 6 showing one example of the analysis results of a p-type semiconductor layer obtained in Example 1 of the present invention).

In the sputtering of metal oxide, when the GaN layer surface is exposed to a plasma at the sputtering, the plasma particle may destroy the crystallinity of the GaN surface. Evidence revealing destruction of the crystallinity is not observed, but high proportion of the semiconductor metal in the semiconductor metal mixed layer and an increase in the film thickness of the mixed layer result. This is considered to occur because the crystallinity of the GaN surface is first destroyed by a plasma particle and the transparent electrically conducting film is then formed, the semiconductor metal, of which the crystal structure is destroyed much more, diffuses into the transparent electrically conducting film.

Accordingly, in order to prevent an increase in the contact resistance, the GaN stacked substrate must be devised not to be exposed to a plasma at the sputtering. Examples of the method therefor include increasing the T-S (target-substrate) distance, increasing the magnetic force of the magnet, and devising the magnet shape to prevent the plasma from spreading toward the substrate direction.

Furthermore, the formation of the transparent electrically conducting film contact layer is preferably performed at a temperature not higher than room temperature. If the p-type semiconductor is heated, the incident particle of the transparent electrically conducting film contact layer is imparted with a diffusion energy from the p-type semiconductor and excessively diffuses to destroy the crystallinity of the semiconductor and form a high-resistance layer.

Heating at 300 to 700° C. after the formation of the transparent electrically conducting film produces a state where diffusion of the transparent electrically conducting film-forming metal and the semiconductor-forming metal is proceeding in the vicinity of the semiconductor/transparent electrically conducting film interface, that is, in the range of less than 3 nm from the interface. At this heat treatment, a long-time treatment allowing for diffusion into the deep part of the semiconductor layer is not performed. The treatment time is preferably from 1 to 30 minutes.

In the case of forming a transparent electrically conducting film current diffusion layer subsequently to the transparent electrically conducting film contact layer, the current diffusion layer is formed by a sputtering method using DC discharge. The current diffusion layer formed by DC discharge sputtering is advantageous in that the density of the transparent electrically conducing film becomes higher than that in the film formation by RF discharge sputtering.

Figure 7:
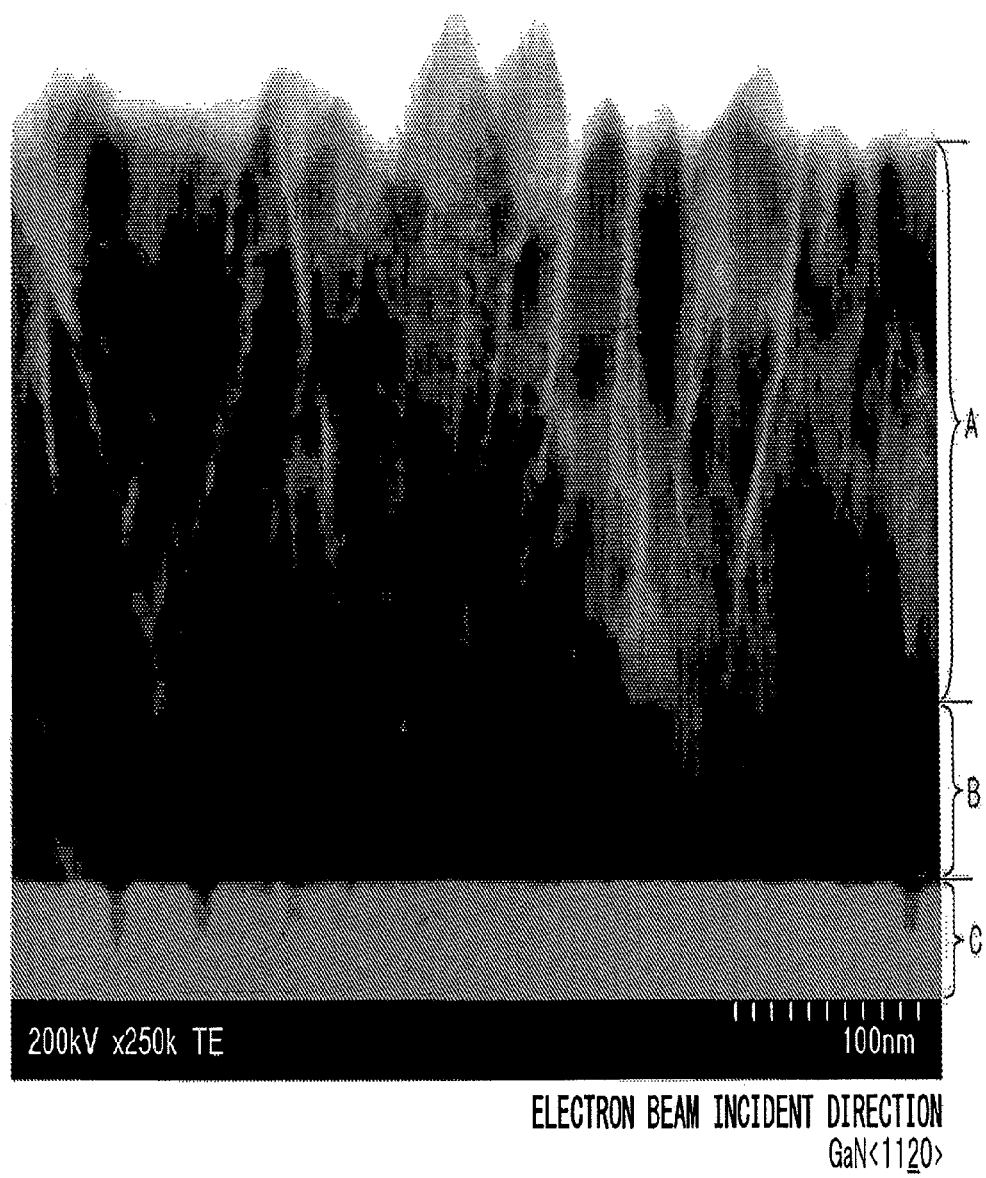
FIG. 7 is a sectional TEM photograph of the transparent electrically conducting film current diffusion layer of a gallium nitride-based compound semiconductor light-emitting device produced in Example 1.

Also, when the transparent electrically conducting layer is formed at room temperature by a DC discharge sputtering method, the current diffusion layer takes different structures between the sides close to and remote from the p-type semiconductor, and the layer on the side remote from the semiconductor side of the current diffusion layer comes to have a more distinct columnar structure with a high density. The layer close to the semiconductor side forms a structure which is not a columnar structure, though a domain is observed. FIG. 7 shows a sectional TEM photograph of the transparent electrically conducting film current diffusion layer in Example 1 of the present invention. As seen from the Figure, a distinct columnar structure is observed in the portion of A. In the portion of B, a domain is observed but the structure is not a columnar structure. The film thickness of this portion is usually from 30 to 100 nm and, by forming the current diffusion layer to a film thickness larger than that, the portion of A having a columnar structure with high crystallinity can be created. C is the semiconductor layer. Incidentally, presence of the transparent electrically conducting film contact layer cannot be confirmed at this magnification.

Sputtering may be carried out using any known conventional sputtering apparatus under any suitably selected conditions conventionally known. A substrate having gallium nitride-based compound semiconductor layers stacked thereon is placed in the chamber. The chamber is evacuated to the degree of vacuum in the range of $10^{-4} \sim 10^{-7}$ Pa. He, Ne, Ar, Kr, Xe, etc. can be used as the sputtering gas. Ar is preferred in view of availability. One of these gases is introduced into the chamber up to the pressure of 0.1~10 Pa, and then, discharge is performed. Preferably the pressure is in the range of 0.2~5 Pa. Supplied electric power is preferably in the range of 0.2~2.0 kW. By suitably adjusting the discharge time and supplied power, the thickness of the formed layer can be adjusted.

As the bonding pad layer, various structures using materials such as Au, Al, Ni and Cu are well known, and these well known materials and structures can be used with no restriction. Preferably, the thickness is in the range of 100~1000 nm. The thickness is more preferably 300 nm or more since higher bondability is obtained with thick bonding pad owing to the property of bonding pads. However, from the viewpoint of production cost, the thickness is preferably 500 nm or less.

The gallium nitride-based compound semiconductor light-emitting device according to the present invention can be used to constitute a lamp by integrally adding a transparent cover by means that are well known in this art. A white lamp can also be produced by combining the gallium nitride-based compound semiconductor light-emitting device of the present invention with a cover containing a phosphor.

Further, a lamp fabricated from a gallium nitride-based compound semiconductor light-emitting device of the present invention exhibits a low driving voltage and a high emission intensity. Therefore, electronic devices such as mobile phones and display panels, each employing a lamp fabricated on the basis of the technique; and machines and apparatuses such as automobiles, computers, and game machines, each employing any of the electronic device can be driven with little electric power and realize excellent characteristics. Particularly, an electric power saving effect is remarkably attained in mobile phones, game machines, toys, and automotive parts, which are driven by a battery.

EXAMPLES

The present invention will next be described in more detail by way of examples, which should not be construed as limiting the invention.

Example 1

Figure 3:
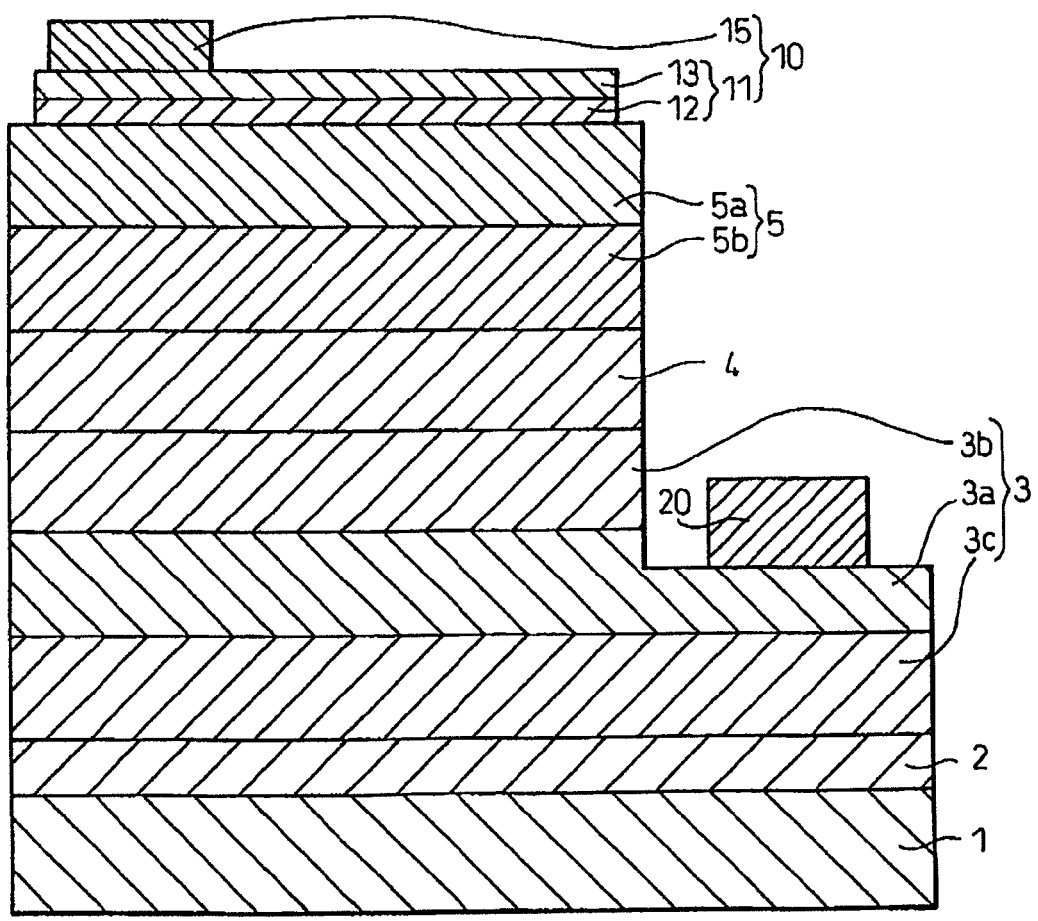
FIG. 3 is a schematic view showing the cross-section of a gallium nitride-based compound semiconductor light-emitting device produced in Example 1.
Figure 4:
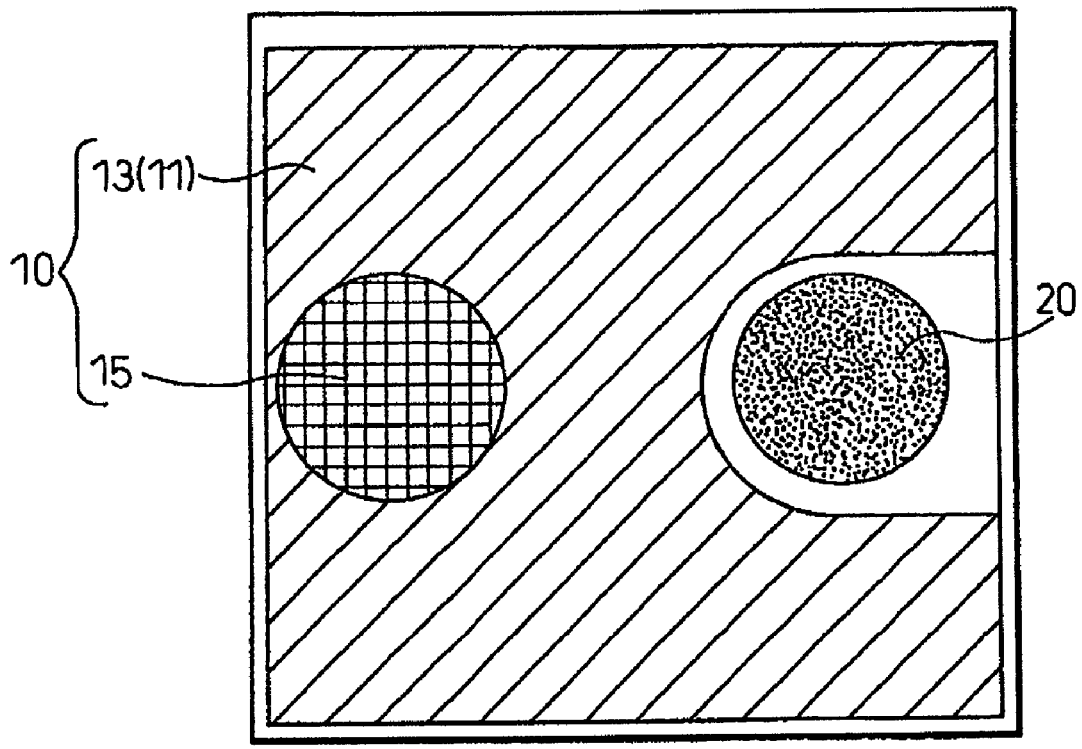
FIG. 4 is a schematic view showing the planar surface of a gallium nitride-based compound semiconductor light-emitting device produced in Example 1.

FIG. 3 is a schematic view showing the cross-section of a gallium nitride-based compound semiconductor light-emitting device produced in this Example, and FIG. 4 is a schematic view showing the planar surface thereof. An n-type semiconductor layer (3) consisting of a 3 µm-thick underlying layer (3c) composed of undoped GaN, a 2 µm-thick n-type contact layer (3a) composed of Si-doped n-type GaN and a 0.03 µm-thick n-type clad layer (3b) composed of n-type $In_{0.1}Ga_{0.9}N$, a light-emitting layer (4) having a multi-quantum well structure in which a 0.03 µm-thick barrier layer composed of Si-doped GaN and a 2.5 nm-thick well layer composed of $In_{0.2}Ga_{0.8}N$ were stacked five times and the barrier layer was finally provided, and a p-type semiconductor layer (5) consisting of a 0.05 µm-thick p-type clad layer (5b) composed of Mg-doped p-type $Al_{0.07}Ga_{0.93}N$ and a 0.15 µm-thick p-type contact layer (5a) composed of Mg-doped p-type GaN were sequentially stacked on a sapphire substrate (1) through a buffer layer (2) composed of AlN. On the p-type contact layer of the resulting gallium nitride-based compound semiconductor stacked structure, a transparent electrically conducting film (11) consisting of a 2 nm-thick transparent electrically conducting film contact layer (12) composed of ITO (indium tin oxide) and a 400 nm-thick transparent electrically conducting film current diffusion layer (13) composed of ITO was formed, and a bonding pad layer (15) having a Cr/Ti/Au three-layer structure (thickness: 4/10/200 nm; Cr is on the ITO side) was formed thereon to provide a positive electrode (10). Subsequently, a negative electrode (20) having a two-layer structure of Ti/Au was formed on the n-type contact layer. In this way, a light-emitting device of the present invention, in which the semiconductor side serves as the light extraction surface, was produced. The positive and negative electrodes each had a shape as shown in FIG. 4.

In the above structure, the carrier concentration in the n-type contact layer composed of n-type GaN was $1\times10^{19}$ $cm^{-3}$, the concentration of Si doping in the barrier layer composed of GaN was $1\times10^{18}$ $cm^{-3}$, the carrier concentration in the p-type contact layer composed of p-type AlGaN was $5\times10^{18}$ $cm^{-3}$, and the concentration of Mg doping in the p-type clad layer composed of p-type AlGaN was $5\times10^{19}$ $cm^{-3}$.

The layers forming the gallium nitride-based compound semiconductor layer were formed by MOCVD under normal conditions well known in the related technical field. The positive and negative electrodes were fabricated in accordance with the following procedure.

First, the portion of the n-type GaN contact layer on which the negative electrode was to be formed was exposed by reactive ion etching in the following manner and an etching mask was formed on the p-type semiconductor layer. The sequence of processing is as follows. After applying a resist uniformly over the entire surface, the resist was removed from the positive electrode area by using a known lithographic technique. Then, the structure was placed in a vacuum evaporation chamber, and using an electron beam method, Ni and Ti were deposited to thicknesses of about 50 nm and 300 nm, respectively, under a pressure of $4\times10^{-4}$ Pa or lower. After that, using a lift-off technique, the metal layers and the resist were removed from all the areas except the positive electrode area.

Next, the substrate with the semiconductor layer fabricated thereon was placed on an electrode in an etching chamber of a reactive ion etching apparatus, and the etching chamber was evacuated to $10^{-4}$ Pa, after which $Cl_2$ as an etching gas was supplied and etching was performed until the n-type contact layer was exposed. After the etching, the substrate was retrieved from the reactive ion etching apparatus, and the etching mask was removed using nitric acid and hydrofluoric acid.

Thereafter, a transparent electrically conducting film contact layer composed of ITO and a transparent electrically conducting film current diffusion layer composed of ITO were formed by known photolithography technique and lift-off technique on the p-type contact layer only in the region where the positive electrode is formed. In the formation of the transparent electrically conducting film contact layer and the transparent electrically conducting film current diffusion layer, the substrate having stacked thereon the gallium nitride-based compound semiconductor layer was placed in a sputtering apparatus and in the state of the substrate temperature being room temperature, ITO of about 2 nm was first film-formed by RF sputtering on the p-type contact layer and ITO of about 400 nm was then stacked thereon by DC sputtering. Incidentally, at the film formation by RF sputtering, the pressure was about 1.0 Pa, and the supply power was 0.5 kW, and at the film formation by DC sputtering, the pressure was about 0.8 Pa, and the supply power was 0.5 kW. The substrate was taken out from the sputtering apparatus and treated according to the known procedure usually called lift-off. Subsequently, a first layer composed of Cr, a second layer composed of Ti and a third layer composed of Au were sequentially stacked by a vapor deposition method on a part of the transparent electrically conducting film current diffusion layer to form a bonding pad layer. In this way, a positive electrode was formed on the p-type contact layer.

The positive electrode formed by this method exhibited light transparency and had a light transmittance of 90% or more in the wavelength region of 460 nm. Incidentally, the light transmittance was measured with a spectrophotometer by using a sample for measurement of light transmittance prepared by stacking a transparent electrically conducting film contact layer and a transparent electrically conducting film current diffusion layer, each having the same thickness as above, on a glass plate. The value of light transmittance was calculated by taking into consideration the blank in the measurement only with a glass plate.

The wafer after the film formation up to the positive electrode was heat-treated in an oven at 550° C. for 10 minutes.

Next, the negative electrode was formed on the exposed n-type contact layer in accordance with the following procedure. After applying a resist uniformly over the entire surface, the resist was removed from the negative electrode area on the exposed n-type contact layer by using a known lithographic technique; then, using the conventional vacuum evaporation method, the negative electrode was formed by depositing Ti and Au to thicknesses of 100 nm and 200 nm, respectively, in this order on the semiconductor. After that, the resist was removed using a known technique.

After the substrate thickness was reduced to 80 μm by grinding and polishing the back surface of the substrate, the wafer with the positive and negative electrodes formed thereon was scribed from the semiconductor layer side by using a laser scriber and, then, stressed and broken apart, thereby separating individual chips each 350 μm square. When each chip was measured by flowing a current of 20 mA using a needle-tipped probe, the forward voltage was 3.3 V.

Then, the chip was mounted in a TO-18 can package, and when the light emission output was measured by a tester, the output at the applied current of 20 mA was 10 mW. Distribution of emission from the light-emitting surface indicated that light emission occurred in the entire area of the light-emitting surface corresponding to the positive electrode.

Through EDS analysis of the sectional TEM images, the thickness of the semiconductor metal mixed layer was estimated to be 3 nm, and the Ga proportion in the layer was estimated to 3 to 50 at. % with respect to all metal atoms (In+Sn+Ga). At the portion 1 nm remote from the semiconductor/positive electrode interface the Ga proportion was 50 at. % with respect to all metal atoms and at the portion 3 nm remote from the semiconductor/positive electrode interface the Ga proportion was 10 at. % or less with respect to all metal atoms. On the other hand, the thickness of the positive electrode metal mixed layer was estimated to be 2 nm. The positive electrode materials existing in the layer were In and Sn constituting the transparent electrically conducting film. These metal proportion in the layer was estimated to 1 to 10 at. % with respect to all metal atoms (In+Sn+Ga). FIG. 5 is an exemplary chart showing results of the EDS analysis of a sectional TEM image of a transparent electrically conducting film contact layer, and FIG. 6 is an exemplary chart showing results of the EDS analysis of a sectional TEM image of a p-type contact layer.

Examples 2 and 3

Gallium nitride-based compound semiconductor light-emitting devices were produced in the same manner as in Example 1 except for changing the film formation condition of the positive electrode (the pressure of the sputtering apparatus at the formation of the transparent electrically conducting film contact layer), and the device characteristics were evaluated. The results obtained are shown in Table 1 together with the results of Example 1. Incidentally, in these light-emitting devices, the thickness of the positive electrode metal mixed layer was from 1 to 5 nm, and the proportion of the positive electrode metal was from 0.5 to 18%. As for the semiconductor metal mixed layer, these are shown in Table 1.

TABLE 1

| | Pressure at Formation of Transparent Electrically conducting Film Contact Layer [Pa] | Semiconductor Metal Mixed Layer | | | Device Characteristics | |
|---|---|---|---|---|---|---|
| | | Thickness [nm] | Proportion of Semiconductor Metal [at. %] | | Forward Voltage [V] | Light Emission Output [mW] |
| | | | Portion of 1 nm from p-Type Contact Layer Interface | Portion of 3 nm from p-Type Contact Layer Interface | | |
| Example 1 | 1 | 3 | 50 | 10 | 3.3 | 9 |
| Example 2 | 0.3 | 3.5 | 50 | 20 | 3.6 | 9 |
| Example 3 | 5 | 3 | 35 | 8 | 3.5 | 9 |
| Example 4 | 1 | 3 | 35 | 10 | 3.5 | 9 |
| Example 5 | 1 | 4 | 55 | 20 | 3.8 | 9 |
| Comparative Example 1 | 1 | 12 | 60 | 30 | 4.2 | 10 |

Example 4

A gallium nitride-based compound semiconductor light-emitting device was produced in the same manner as in Example 1 except for not performing the heat treatment after the formation of the positive electrode. Its device characteristics are shown also in Table 1.

Example 5

A gallium nitride-based compound semiconductor light-emitting device was produced in the same manner as in Example 1 except for heating the substrate to 200° C. at the formation of the transparent electrically conducting film contact layer. Its device characteristics are shown also in Table 1.

Comparative Example 1

A gallium nitride-based compound semiconductor light-emitting device was produced in the same manner as in Example 1 except for not forming the transparent electrically conducting film contact layer. Its device characteristics are shown also in Table 1.

INDUSTRIAL APPLICABILITY

The gallium nitride-based compound semiconductor light-emitting device provided by the present invention has excellent characteristics and productivity and is useful as a material for light-emitting diodes, lamps and the like.

The invention claimed is:

1. A gallium nitride-based compound semiconductor light-emitting device comprising
    an n-type semiconductor layer, a light-emitting layer and a p-type semiconductor layer which are formed in this order on a substrate, wherein each layer comprises a gallium nitride-based compound semiconductor,
    the light-emitting device has a negative electrode and a positive electrode provided on the n-type semiconductor layer and on the p-type semiconductor layer, respectively,
    the positive electrode is at least partially formed of a transparent electrically conducting film comprising a transparent electrically conducting material,
    the transparent electrically conducting film is at least partially in contact with the p-type semiconductor layer, and
    a region having a semiconductor metal concentration of 20 at.% or more based on all metals in the transparent electrically conducting film is present in the transparent electrically conducting film on the semiconductor side surface of the transparent electrically conducting film, and
    wherein a positive electrode metal mixed layer containing a metal component of the transparent electrically conducting film is present in the p-type semiconductor layer, wherein the concentration of the transparent electrically conducting film metal component in the positive electrode metal mixed layer is from 0.1 to 20 at.% based on all metals in the positive electrode metal mixed layer.

2. The gallium nitride-based compound semiconductor light-emitting device according to claim 1, wherein a region having a semiconductor metal concentration of 40 at. % or more based on all metals in the transparent electrically conducting film is present in the transparent electrically conducting film in the range of less than 3 nm from the semiconductor/transparent electrically conducting film interface.

3. The gallium nitride-based compound semiconductor light-emitting device according to claim 1, wherein the semiconductor metal concentration of the transparent electrically conducting film in the range of less than 3 nm or more from the semiconductor/transparent electrically conducting film interface is 15 at. % or less based on all metals in the transparent electrically conducting film.

4. The gallium nitride-based compound semiconductor light-emitting device according to claim 1, wherein the transparent electrically conducting film is formed at room temperature and, after the film formation, is heat-treated at 300 to 700° C.

5. The gallium nitride-based compound semiconductor light-emitting device according to claim 1, wherein the transparent electrically conducting film comprises a transparent electrically conducting film contact layer and a transparent electrically conducting film current diffusion layer, and the transparent electrically conducting film current diffusion layer, and the transparent electrically conducting film contact layer is in contact with the p-type semiconductor layer.

6. The gallium nitride-based compound semiconductor light-emitting device according to claim 5, wherein the transparent electrically conducting film contact layer is formed by an RF sputtering method.

7. The gallium nitride-based compound semiconductor light-emitting device according to claim 5, wherein the transparent electrically conducting film current diffusion layer is formed by a DC sputtering method.

8. The gallium nitride-based compound semiconductor light-emitting device according to claim 5, wherein the thickness of the transparent electrically conducting film layer is from 1 to 5 nm.

9. The gallium nitride-based compound semiconductor light-emitting device according to claim 5 wherein the thickness of the transparent electrically conducting film contact layer is from 150 to 500 nm.

10. The gallium nitride-based compound semiconductor light-emitting device according to claim 5, wherein the transparent electrically conducting film current diffusion layer has a columnar structure in a side remote from the p-type semiconductor-layer, and a structure different from a columnar structure in a side close to the p-type semiconductor layer.

11. The gallium nitride-based compound semiconductor light-emitting device according to claim 10, wherein the film thickness of the structure layer on the side closer to the semiconductor is from 30 to 100 nm.

12. The gallium nitride-based compound semiconductor light-emitting device according to claim 1, wherein the transparent electrically conducting film comprises an oxide of at least one metal selected from the group consisting of In, Sn, Zn, Al, Ti, V, Cr, Mn, Fe, Co, Ni, Cu, Ga, Ge, Y, Zr, Nb, Mo, Tc, Ru, Rh, Pd, Ag, Sb, Hf, Ta, W, Re, Os, Ir and Pt.

13. The gallium nitride-based compound semiconductor light-emitting device according to claim 12, wherein the transparent electrically conducting film comprises an oxide of at least one metal selected from the group consisting of In, Sn, Zn, Al, Cu, Ag, Ga, Ge, Mo, W, and Cr.

14. A lamp comprising the gallium nitride-based compound semiconductor light-emitting device according to claim 1.

15. An electronic device incorporating the lamp according to claim 14.

16. A machine incorporating the electronic device according to claim 15.

* * * * *